US011368011B2

(12) United States Patent
He et al.

(10) Patent No.: US 11,368,011 B2
(45) Date of Patent: Jun. 21, 2022

(54) INTERMEDIATE RELAY MALOPERATION PREVENTING DEVICE AND METHOD BASED ON IMPROVED RECURSIVE WAVELET ALGORITHM

(71) Applicant: WUHAN UNIVERSITY, Hubei (CN)

(72) Inventors: Yigang He, Hubei (CN); Jianbo Zhou, Hubei (CN); Hui Zhang, Hubei (CN); Liulu He, Hubei (CN); Weibo Yuan, Hubei (CN); Yi Ruan, Hubei (CN); Bing Li, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 50 days.

(21) Appl. No.: 16/944,176

(22) Filed: Jul. 31, 2020

(65) Prior Publication Data
US 2021/0036503 A1  Feb. 4, 2021

(30) Foreign Application Priority Data
Aug. 1, 2019  (CN) .......................... 201910708941.3

(51) Int. Cl.
*G01R 19/25* (2006.01)
*G01R 19/252* (2006.01)
*G01R 19/255* (2006.01)
*G01R 19/257* (2006.01)
(Continued)

(52) U.S. Cl.
CPC ............ *H02H 3/05* (2013.01); *G01R 19/2503* (2013.01); *G01R 31/3278* (2013.01)

(58) Field of Classification Search
CPC .... H02H 3/05; H03K 19/003; G01R 19/2503; G01R 19/2506; G01R 19/2509; G01R 19/2512; G01R 19/2516; G01R 19/252; G01R 19/257; G01R 31/3278; G01R 19/3278
See application file for complete search history.

(56) References Cited

U.S. PATENT DOCUMENTS 5,909,656 A * 6/1999 Yang ........................ G06F 17/14
                                                       702/77
6,137,666 A * 10/2000 Wang ................... H02H 1/0092
                                                       361/80
(Continued)

*Primary Examiner* — Sisay G Tiku
(74) *Attorney, Agent, or Firm* — JCIPRNET

(57) ABSTRACT

An intermediate relay maloperation preventing device and method based on an improved recursive wavelet algorithm is provided. The device includes a power supply module, a voltage sampling circuit, an analog-to-digital conversion module, a DSP chip, and a relay maloperation signal shielding module. The voltage sampling circuit is connected to the analog-to-digital conversion module. The analog-to-digital conversion module is connected to the DSP chip. The DSP chip is connected to and controls a relay signal control module. The voltage sampling circuit collects a voltage. An improved recursive wavelet is used to extract a voltage feature. As such, identification of a fault signal and a normal signal is achieved, and real-time fault monitoring is accomplished. The detection method may be easily implemented, exhibits good filtering performance and anti-interference capability, delivers high detection accuracy, and may accomplish real-time online monitoring of intermediate relay faults.

10 Claims, 3 Drawing Sheets

(51) Int. Cl.
*G01R 31/327* (2006.01)
*H02H 3/05* (2006.01)

(56) References Cited

U.S. PATENT DOCUMENTS

| | | | | |
|---|---|---|---|---|
| 2004/0264094 | A1* | 12/2004 | Rahman | H02H 7/0455 361/115 |
| 2008/0111680 | A1* | 5/2008 | Presicci | G08B 13/2491 340/539.22 |
| 2010/0324845 | A1* | 12/2010 | Spanier | G01R 21/133 702/62 |
| 2011/0282545 | A1* | 11/2011 | Karatsinides | B60K 23/00 701/36 |
| 2013/0027238 | A1* | 1/2013 | Acharya | G01R 19/2503 341/155 |
| 2014/0159701 | A1* | 6/2014 | Nabielec | G01R 15/06 323/364 |

* cited by examiner

INTERMEDIATE RELAY MALOPERATION PREVENTING DEVICE AND METHOD BASED ON IMPROVED RECURSIVE WAVELET ALGORITHM

CROSS-REFERENCE TO RELATED APPLICATION

This application claims the priority benefit of China application serial no. 201910708941.3, filed on Aug. 1, 2019. The entirety of the above-mentioned patent application is hereby incorporated by reference herein and made a part of this specification.

BACKGROUND

Technical Field

The disclosure relates to a field of power system security, and in particular, to an intermediate relay maloperation preventing device and method based on an improved recursive wavelet algorithm.

Description of Related Art

In a power system, the secondary circuit relay protection protects the primary circuit failure. In terms of power system fault protection, a relay exhibits good selectivity, quickness, sensitivity, and reliability and may correctly remove a primary system failure.

The rapid development of large-scale integrated circuit technology and the widespread applications of microprocessors and microcomputers have greatly promoted the development of digital relay protection technology. As such, the system in the direct current secondary circuit becomes increasingly complex, which makes the detection of system failures more and more difficult.

In recent years, with the extensive use of relays, the length of the direct current bus in the power system is getting longer and longer. A long direct current bus may increase the bus capacitance to ground. When the direct current bus insulation detection switch is switched, it may cause the switch to charge to the ground, thereby causing a maloperation in a relay. A number of relay maloperation incidents have occurred so far. Since quickness is required by a relay when protecting a circuit, real-time performance is required during relay fault detection, and the research on maloperation preventing algorithms is thereby limited.

SUMMARY

The disclosure provides an intermediate relay maloperation preventing device and method based on an improved recursive wavelet algorithm to accomplish detection and prevention of a relay maloperation.

Technical solutions provided by the disclosure includes the following.

An intermediate relay maloperation preventing device based on an improved recursive wavelet algorithm is provided and includes a power supply module and a voltage sampling circuit, an analog-to-digital conversion module, a digital signal processing (DSP) module, and a relay maloperation signal shielding module connected in sequence.

The power supply module is configured to supply power to the voltage sampling circuit, the analog-to-digital conversion module, the DSP module, and the relay maloperation signal shielding module.

The voltage sampling circuit samples a terminal voltage of an intermediate relay.

The DSP module sends a sampling instruction to the analog-to-digital conversion module. The analog-to-digital conversion module starts sampling according to the sampling instruction, converts a collected voltage analog quantity into a digital signal, and transmits the digital signal to the DSP module. The DSP module performs a recursive wavelet transform on a signal, compares a feature quantity of a voltage signal with a predetermined fault threshold interval through a recursive wavelet transform valuation, determines a fault type, and sends a control signal through the relay maloperation signal shielding module to shield a relay operation signal.

Based on the foregoing technical solutions, the voltage sampling circuit includes two high-precision sampling resistors connected in series, and the two high-precision sampling resistors connected in series are connected in parallel at two terminals of the intermediate relay.

Based on the foregoing technical solutions, the relay maloperation signal shielding module includes the digital-to-analog conversion module and a signal amplifier circuit, and the digital-to-analog conversion module is connected to the DSP module. The relay maloperation signal shielding module sends a low electrical level signal when a fault is detected and amplifies the electrical level signal to a same amplitude as the relay operation signal through the signal amplifier circuit.

Based on the foregoing technical solutions, the DSP module specifically performs the recursive wavelet transform on the voltage signal after analog-to-digital conversion, extracts the feature quantity of the voltage signal, compares the feature quantity of the voltage signal with a predetermined threshold interval, and determines a fault type.

The disclosure further provides a method of performing real-time monitoring on a relay maloperation according to the intermediate relay maloperation preventing device based on the improved recursive wavelet algorithm, and the method includes the following step.

In step (1), a voltage sampling circuit is activated to sample a terminal voltage of an intermediate relay, and a sampled voltage is transmitted to an analog-to-digital conversion module.

In step (2), The sampled voltage is processed by using the analog-to-digital conversion module, an analog voltage is converted into a digital signal, the digital signal is transmitted to a DSP module, and step (3) is then performed.

In step (3), the DSP module performs the recursive wavelet transform on the voltage signal after analog-to-digital conversion and extracts a feature quantity of the voltage signal (the feature quantity refers to a voltage amplitude and a phase, the voltage amplitude of the relay is mainly treated as the feature quantity when a fault occurs herein), and step (4) is performed.

In step (4), the feature quantity of the voltage signal is compared with a predetermined fault threshold interval, a fault type is determined, and it indicates that the relay operates normally if the feature quantity of the voltage signal is greater than a fourth threshold $\delta_4$, step (6) is performed; otherwise step (5) is performed.

In step (5), the relay shows a high-resistance ground fault if the feature quantity of the voltage signal is greater than or equal to a threshold $\delta_0$ and less than a first threshold $\delta_1$, the relay shows a ground short circuit fault if the feature quantity of the voltage signal is greater than or equal to the first threshold $\delta_1$ and less than a second threshold $\delta_2$, and an alternating current crosstalk fault is presented if the feature quantity of the voltage signal is less than a third threshold $-\delta_3$, and step (7) is performed.

Valuations of feature values of recursive wavelets in different signals differ greatly, so different thresholds are configured to distinguish fault features. A minimum fault feature quantity is provided through resistor grounding, a fault threshold interval is $(\delta_0, \delta_1)$. A fault feature value of a metal grounding short circuit is greater a feature value of resistor grounding, a fault threshold interval is $[\delta_1, \delta_2)$. A feature quantity of an alternating current crosstalk signal is a negative value, an amplitude of the alternating current crosstalk signal is greater than amplitudes of resistor grounding and metal grounding, so a fault threshold interval thereof is configured as $[\delta_2, \delta_3)$. A normal operation is configured to be greater than $\delta_4$, and a certain margin is provided between $\delta_3$ and $\delta_4$ to satisfy identification between a normal operation and a fault.

In step (6), the relay operates normally, a maloperation preventing device takes no measure, and the voltage sampling circuit continues to work.

In step (7), a shielding signal is sent to shield a relay operation signal, a maloperation of the relay is prevented, and step (1) is performed after this step is completed.

Based on the foregoing technical solutions, in step (7), the step of sending the shielding signal by the relay maloperation signal shielding module further includes the following.

A low electrical level signal is sent by the relay maloperation signal shielding module when a fault is detected, the electrical level signal is amplified to a same amplitude as the relay operation signal by a signal amplifier circuit, and the relay operation signal is pulled down to prevent a relay maloperation from occurring.

Based on the foregoing technical solutions, in step (1), the step of activating the voltage sampling circuit to sample the terminal voltage of the intermediate relay further includes the following. A sampled voltage on a small resistor in the voltage sampling circuit is transmitted to the analog-to-digital conversion module.

Effects provided by the disclosure includes the following. In the disclosure, the voltage of the voltage sampling circuit is collected, and the voltage feature is extracted by using the improved recursive wavelet. As such, identification of a fault signal and a normal signal is achieved, and real-time fault monitoring is accomplished. The detection method provided by the disclosure may be easily implemented, exhibits good filtering performance and anti-interference capability, delivers high detection accuracy, and may accomplish real-time online monitoring of intermediate relay faults.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The disclosure is further described in detail in combination with accompanying figures and embodiments.

The operational speed of an intermediate relay is usually provided in a microsecond level, so that a maloperation preventing device is required to exhibit good real-time performance. Through a recursive wavelet, a fault of the relay may be determined at 8 sampling points. In this way, the fault may be quickly positioned, and a measure may be taken.

Figure 1:
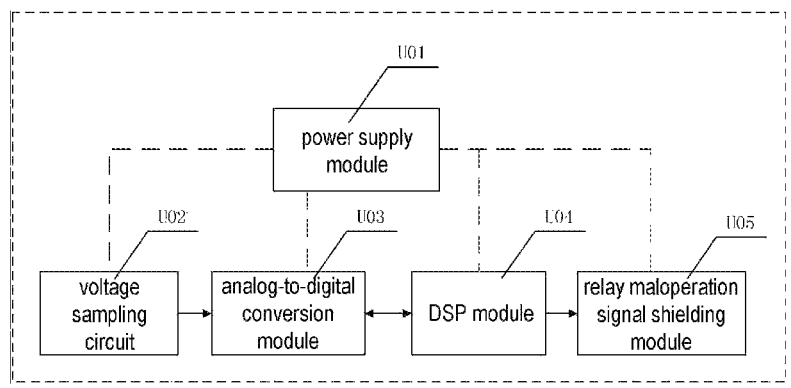
FIG. 1 is a schematic view of an entire intermediate relay maloperation preventing device based on an improved recursive wavelet algorithm.

With reference to FIG. 1, an intermediate relay maloperation preventing device based on an improved recursive wavelet algorithm includes a power supply module U01, a voltage sampling circuit U02, an analog-to-digital conversion module U03, a DSP module U04, and a relay maloperation signal shielding module U05.

The power supply module U01 is configured to supply power to the DSP module U04, the voltage sampling circuit U02, the analog-to-digital conversion module U03, the DSP module, and the relay maloperation signal shielding module U05. In the embodiments of the disclosure, the power supply module U01 may a 5V direct current voltage and a 3.3V direct current voltage for power supply. The 5V direct current voltage is used to power the relay maloperation signal shielding module, and the 3.3V direct current voltage is used to power the DSP module U04 and the analog-to-digital conversion module U03.

The voltage sampling circuit U02 is connected to the analog-to-digital conversion module U03. The analog-to-digital conversion module U03 is connected to the DSP module U04. The DSP module U04 is connected to the relay maloperation signal shielding module U05.

The voltage sampling circuit U02 samples a terminal voltage of an intermediate relay. The DSP module U04 sends a sampling instruction to the analog-to-digital conversion module U03, and the analog-to-digital conversion module U03 receives the instruction and starts sampling. The analog-to-digital conversion module U03 converts a collected voltage analog quantity into a digital signal and transmits the digital signal to the DSP module U04. The DSP module performs a recursive wavelet transform on a signal, determines a fault type through an amplitude of the recursive wavelet transform, and sends a control signal through the relay maloperation signal shielding module U05 to shield a relay operation signal.

Figure 2:
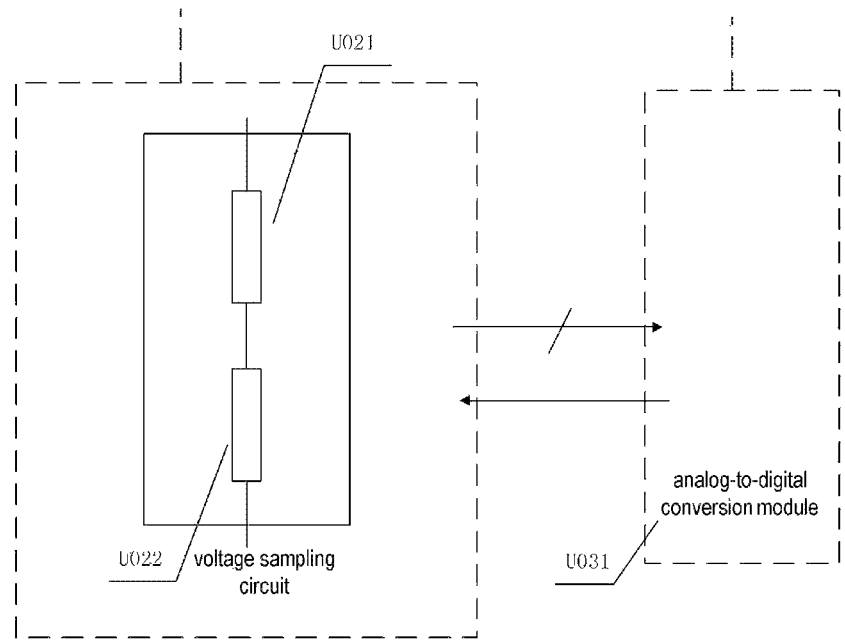
FIG. 2 is a schematic view of a structure of a voltage divider module.

With reference to FIG. 2, the voltage sampling circuit U02 includes 2 high-precision sampling resistors U021 and U022. The sampling resistors are connected in series first and then are connected in parallel at two terminals of the relay. As in a general case, 100-ohm and 5-ohm resistors are selected to act as the sampling resistors in the embodiments of the disclosure, and the model numbers respectively are EE1/20-10R-F-C3 and EE1/20-100R-F-C3.

Figure 3:
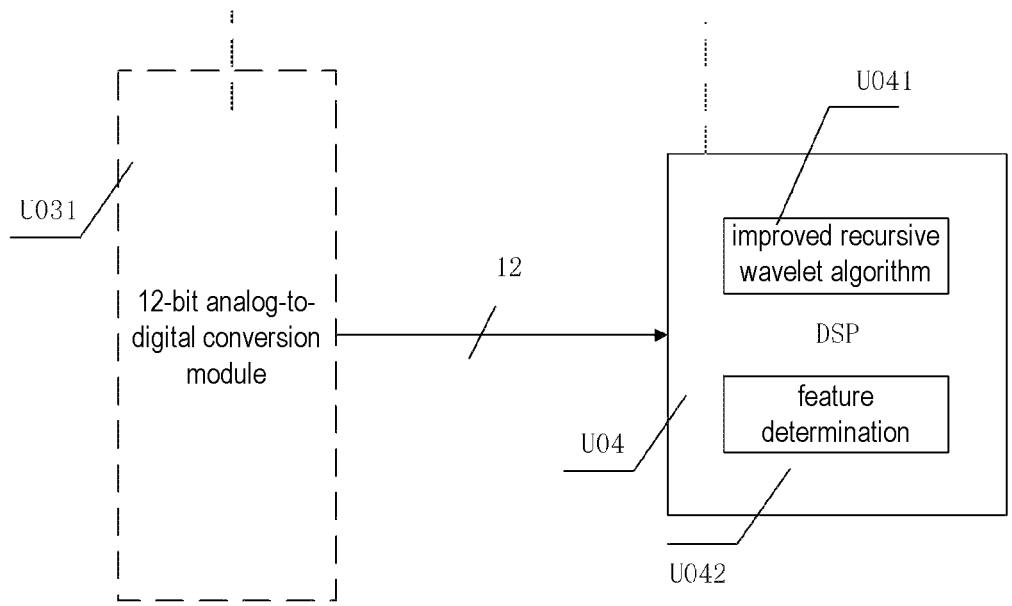
FIG. 3 is a schematic view of connection of an analog-to-digital conversion module and a DSP module.

With reference to FIG. 3, the analog-to-digital conversion module U03 uses a 16-channel 12-bit ADC module. As in a general case, the analog-to-digital conversion module built into the DSP is selected herein.

With reference to FIG. 3, as in a general case, a DSP with a model number of TMS320F28235 is selected to act as the DSP module U04.

Figure 4:
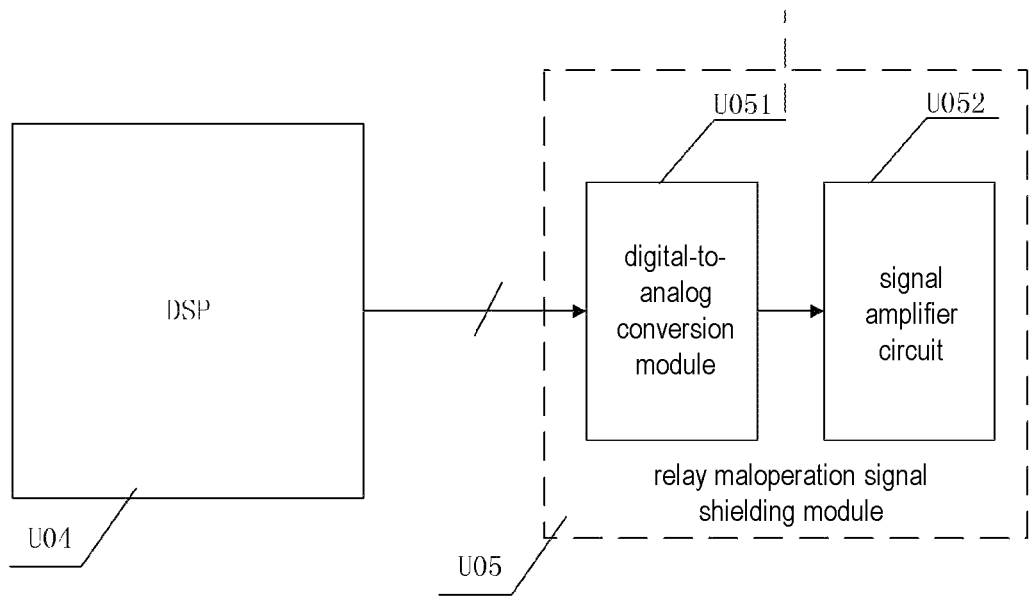
FIG. 4 is a schematic view of connection of the DSP module and a relay maloperation signal shielding module.

With reference to FIG. 4, the relay maloperation signal shielding module U05 includes a digital-to-analog conversion module U051 and a signal amplifier circuit U052. As in a general case, the model number of Risym ADS1115 is selected for the digital-to-analog conversion module, and Risym LM358 having a gain of 100 is selected for a voltage amplifier module.

Figure 5:
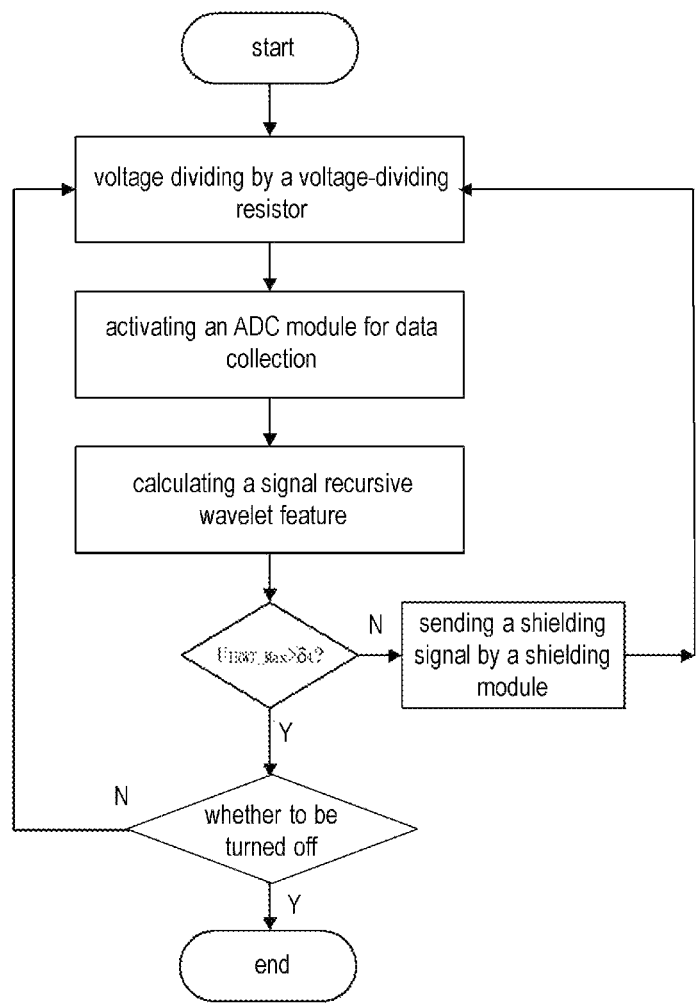
FIG. 5 is a flow chart of a method of monitoring the intermediate relay maloperation preventing device based on the improved recursive wavelet algorithm.

With reference to FIG. 5, a method of preventing a relay maloperation by using the intermediate relay maloperation preventing device based on the improved recursive wavelet algorithm includes the following steps.

In step (1), the terminal voltage of the relay is divided through a voltage-dividing resistor in the voltage sampling circuit U02. The terminal voltage of the resistor U021 having a smaller voltage divider resistance is used for sampling an analog-to-digital conversion module voltage. A terminal voltage amplitude of the relay is:

$$U_0 = \frac{U_{R_1}(R_1 + R_2)}{R_1},$$

where $U_0$ is a relay terminal voltage, $U_R$ is a sampling resistor voltage, $R_1$ is a sampling resistance, and $R_2$ is a voltage divider resistance.

In step (2), the DSP module U04 sends a sampling instruction to the analog-to-digital conversion module U03. The analog-to-digital conversion module U03 receives the sampling instruction, samples the relay terminal voltage, sends a collected voltage signal to the DSP module U04 after analog-to-digital conversion, and goes to step (3).

In step (3), an improved recursive wavelet transform is performed on the signal in the DSP module U04, an amplitude of the recursive wavelet is obtained, and step (4) is then performed.
The improved recursive wavelet transform is:
An expression of a mother wavelet of the recursive wavelet is:

$$\psi(t) = \left(\frac{\eta^4 t^4}{12} - \frac{\eta^5 t^5}{30} + \frac{\eta^6 t^6}{90}\right) \cdot e^{(-\eta + j w_0 t)} \cdot u(t). \quad (1)$$

In order to make the mother wavelet meet an allowable condition, let $$\frac{\omega_0}{\eta} = \sqrt{3}.$$

Herein, $\eta = 2\pi/\sqrt{3}$, where $\omega_0$ is a signal frequency, $\eta$ is a coefficient of Newton-Cortez formula, and $u(t)$ is a step function. A wavelet scale factor $\alpha$ is added, a Fourier transform is performed, and the following is obtained:

$$\psi_a(w) = \sqrt{a} \cdot \frac{6\eta^6 - 2\eta^4[a(w - 2\pi f)]^2}{[\eta + ja(w - 2\pi f)]^7}. \quad (2)$$

Discretization is performed on the wavelet. T is a sampling cycle. A translation parameter k is introduced. A discrete sequence convolution is detected through formula (5) to obtain:

$$W_{a,k} = \frac{1}{\sqrt{a}} \cdot T \cdot [x(k) * \psi(k)]. \quad (3)$$

Z transforms performed to formula (3) include:

$$W(z) = \frac{1}{\sqrt{a}} \cdot T \cdot x(z)\psi(z) \quad (4)$$

$$\psi(z) = \sum_{i=1}^{6} \eta_i z^{-i} / 1 + \sum_{j=1}^{7} \lambda_j z^{-j}.$$

In the formulas, $\eta_i$ and $\lambda_j$ are corresponding Z transform coefficients.
An improved fast recursive wavelet transform formula is:

$$W(a, k) = \frac{1}{\sqrt{a}} \cdot T \cdot \left[\sum_{i=1}^{6} \eta_i x(k - i) - \sum_{i=1}^{7} \lambda_j W(k - j)\right]. \quad (5)$$

Through the recursive wavelet transforms performed through formulas (1) to (4), a recursive wavelet amplitude is obtained, and such amplitude is $U_{IRTW}$.

In step (4), values of a recursive wavelet amplitude $U_{IRWT\_MAX}$ (referring to a maximum recursive wavelet value to be achieved by sampling data, and if the maximum value reaches a threshold interval, it may be determined that whether a maloperation occurs) and a threshold of a normal operation are determined, and if $U_{IRWT\_MAX} > \delta_4$, step (5) is performed; otherwise, step (7) is performed.

The threshold in step (4) is defined by detecting an operation voltage of the relay. 50% to 70% of a relay fault voltage is treated as a threshold voltage. First, a relay normal operation recursive wavelet voltage amplitude $U_{IRTW\_S}$ (a standard recursive wavelet value calculated through the rated voltage, configured to calculate a fault interval to obtain the fault threshold interval) is obtained through a relay rated voltage U0 and formulas (1) to (4). Generally, a high-resistance ground fault amplitude is 50% to 70% of the $U_{IRTW\_S}$. A short circuit fault is 80% to 90% of the $U_{IRTW\_S}$, and alternating current crosstalk is −150% of the $U_{IRTW\_S}$.

In step (5), the recursive wavelet amplitude and a fault recursive wavelet amplitude are compared to determine a fault type.

Further, if the threshold is greater than or equal to $\delta_0$ and less than $\delta_1$, the relay shows a high-resistance ground fault. If the threshold is greater than or equal to $\delta_1$ and less than $\delta_2$, the relay shows a ground short circuit fault. If the threshold is less than $-\delta_3$, the fault is alternating current crosstalk. $\delta_0$ is 50% to 70% of $U_{IRTW\_S}$ (recursive wavelet normal voltage amplitude), $\delta_1$ is 80% to 90% of $U_{IRTW\_S}$, $\delta_3$ is 100% of $U_{IRTW\_S}$, and $\delta_4$ is −150% of $U_{IRTW\_S}$.

In step (6), the relay maloperation signal shielding module U05 sends a shielding signal, pulls down a relay operation signal, and prevents a maloperation of the relay. Step (1) is performed again to continue sampling.

Step (7) is completed, and step (8) is then performed.

Step (8) ends.

In view of the foregoing, compared to the related art, advantages of the disclosure includes the following.
(1) The device provided by the disclosure exhibits a good anti-interference characteristic and may work in a complex environment.

(2) In the disclosure, a signal is processed through the DSP, so that real-time performance is provided, and quickness of a relay is thereby satisfied.

(3) The maloperation preventing device imposes no impact on a system when a relay operation is not detected, and favorable security is thereby provided.

It should be noted that in the specification, relational terms such as up and down are only used to indicate the distinction between an entity or operation and another entity or operation, and do not necessarily require or imply the relationship or order between these entities or operations. Moreover, the terms "comprising", "including", or other variations are intended to cover non-exclusive inclusions.

The following illustrations are simply some preferred embodiments of the disclosure and should not be used to limit the protection scope of the disclosure. Any modifications, equivalent replacements, and modifications made without departing from the spirit and principles of the disclosure should fall within the protection scope of the disclosure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An intermediate relay maloperation preventing device based on an improved recursive wavelet algorithm, comprising a power supply module and a voltage sampling circuit, an analog-to-digital conversion module, a DSP module, and a relay maloperation signal shielding module connected in sequence, wherein
the power supply module is configured to supply power to the voltage sampling circuit, the analog-to-digital conversion module, the DSP module, and the relay maloperation signal shielding module,
the voltage sampling circuit samples a terminal voltage of an intermediate relay,
the DSP module sends a sampling instruction to the analog-to-digital conversion module, the analog-to-digital conversion module starts sampling according to the sampling instruction, converts a collected voltage analog quantity into a digital signal, and transmits the digital signal to the DSP module, and the DSP module performs a recursive wavelet transform on a signal, compares a feature quantity of a voltage signal with a predetermined fault threshold interval through a recursive wavelet transform valuation, determines a fault type, and sends a control signal through the relay maloperation signal shielding module to shield a relay operation signal,
the relay maloperation signal shielding module comprises a digital-to-analog conversion module and a signal amplifier circuit, the digital-to-analog conversion module is connected to the DSP module, and the relay maloperation signal shielding module sends a low electrical level signal when a fault is detected and amplifies the electrical level signal to a same amplitude as the relay operation signal through the signal amplifier circuit.

2. The intermediate relay maloperation preventing device based on the improved recursive wavelet algorithm according to claim 1, wherein the voltage sampling circuit comprises two high-precision sampling resistors connected in series, and the two high-precision sampling resistors connected in series are connected in parallel at two terminals of the intermediate relay.

3. The intermediate relay maloperation preventing device based on the improved recursive wavelet algorithm according to claim 2, wherein the DSP module specifically performs the recursive wavelet transform on the voltage signal after the analog-to-digital conversion, extracts the feature quantity of the voltage signal, compares the feature quantity of the voltage signal with a predetermined threshold interval, and determines the fault type.

4. A method of performing real-time monitoring on a relay maloperation according to the intermediate relay maloperation preventing device based on the improved recursive wavelet algorithm according to claim 2, wherein the method comprises the following step:
in step (1), activating the voltage sampling circuit to sample the terminal voltage of the intermediate relay and transmitting a sampled voltage to the analog-to-digital conversion module;
in step (2), processing the sampled voltage by using the analog-to-digital conversion module, converting an analog voltage into the digital signal, transmitting the digital signal to the DSP module, going to step (3);
in step (3), performing the recursive wavelet transform on the voltage signal after the analog-to-digital conversion and extracting the feature quantity of the voltage signal by the DSP module, going to step (4);
in step (4), comparing the feature quantity of the voltage signal with the predetermined fault threshold interval, determining the fault type, wherein it indicates that the relay operates normally if the feature quantity of the voltage signal is greater than a fourth threshold $\delta_4$, going to step (6), otherwise going to step (5);
in step (5), wherein the relay shows a high-resistance ground fault if the feature quantity of the voltage signal is greater than or equal to a threshold $\delta_0$ and less than a first threshold $\delta_1$, the relay shows a ground short circuit fault if the feature quantity of the voltage signal is greater than or equal to the first threshold $\delta_1$ and less than a second threshold $\delta_2$, and an alternating current crosstalk fault is presented if the feature quantity of the voltage signal is less than a third threshold $-\delta_3$, going to step (7);
wherein valuations of feature values of recursive wavelets in different signals differ greatly, so different thresholds are configured to distinguish fault features, wherein a minimum fault feature quantity is provided through resistor grounding, a fault threshold interval is $(\delta_0, \delta_1)$, a fault feature value of a metal grounding short circuit is greater a feature value of resistor grounding, the fault threshold interval is $[\delta_1, \delta_2)$, a feature quantity of an alternating current crosstalk signal is a negative value, an amplitude of the alternating current crosstalk signal is greater than amplitudes of resistor grounding and metal grounding, so the fault threshold interval thereof is configured as $[\delta_2, \delta_3)$, a normal operation is configured to be greater than $\delta_4$, and a certain margin is provided between $\delta_3$ and $\delta_4$ to satisfy identification between the normal operation and a fault;
in step (6), wherein the relay operates normally, a maloperation preventing device takes no measure, and the voltage sampling circuit continues to work;
in step (7), sending a shielding signal to shield the relay operation signal and to prevent the relay maloperation, going to step (1) after this step is completed.

5. The method according to claim 4, wherein in step (7), the step of sending the shielding signal by the relay maloperation signal shielding module further comprises:

sending a low electrical level signal by the relay maloperation signal shielding module when a fault is detected, amplifying the electrical level signal to a same amplitude as the relay operation signal by a signal amplifier circuit, and pulling down the relay operation signal to prevent the relay maloperation from occurring.

6. The method according to claim 4, wherein in step (1), the step of activating the voltage sampling circuit to sample the terminal voltage of the intermediate relay further comprises: transmitting the sampled voltage on a small resistor in the voltage sampling circuit to the analog-to-digital conversion module.

7. The intermediate relay maloperation preventing device based on the improved recursive wavelet algorithm according to claim 1, wherein the DSP module specifically performs the recursive wavelet transform on the voltage signal after the analog-to-digital conversion, extracts the feature quantity of the voltage signal, compares the feature quantity of the voltage signal with a predetermined threshold interval, and determines the fault type.

8. A method of performing real-time monitoring on a relay maloperation according to the intermediate relay maloperation preventing device based on the improved recursive wavelet algorithm according to claim 1, wherein the method comprises the following step:

in step (1), activating the voltage sampling circuit to sample the terminal voltage of the intermediate relay and transmitting a sampled voltage to the analog-to-digital conversion module;

in step (2), processing the sampled voltage by using the analog-to-digital conversion module, converting an analog voltage into the digital signal, transmitting the digital signal to the DSP module, going to step (3);

in step (3), performing the recursive wavelet transform on the voltage signal after the analog-to-digital conversion and extracting the feature quantity of the voltage signal by the DSP module, going to step (4);

in step (4), comparing the feature quantity of the voltage signal with the predetermined fault threshold interval, determining the fault type, wherein it indicates that the relay operates normally if the feature quantity of the voltage signal is greater than a fourth threshold $\delta_4$, going to step (6), otherwise going to step (5);

in step (5), wherein the relay shows a high-resistance ground fault if the feature quantity of the voltage signal is greater than or equal to a threshold $\delta_0$ and less than a first threshold $\delta_1$, the relay shows a ground short circuit fault if the feature quantity of the voltage signal is greater than or equal to the first threshold $\delta_1$ and less than a second threshold $\delta_2$, and an alternating current crosstalk fault is presented if the feature quantity of the voltage signal is less than a third threshold $-\delta_3$, going to step (7);

wherein valuations of feature values of recursive wavelets in different signals differ greatly, so different thresholds are configured to distinguish fault features, wherein a minimum fault feature quantity is provided through resistor grounding, a fault threshold interval is $(\delta_0, \delta_1)$, a fault feature value of a metal grounding short circuit is greater a feature value of resistor grounding, the fault threshold interval is $[\delta_1, \delta_2)$, a feature quantity of an alternating current crosstalk signal is a negative value, an amplitude of the alternating current crosstalk signal is greater than amplitudes of resistor grounding and metal grounding, so the fault threshold interval thereof is configured as $[\delta_2, \delta_3)$, a normal operation is configured to be greater than $\delta_4$, and a certain margin is provided between $\delta_3$ and $\delta_4$ to satisfy identification between the normal operation and a fault;

in step (6), wherein the relay operates normally, a maloperation preventing device takes no measure, and the voltage sampling circuit continues to work;

in step (7), sending a shielding signal to shield the relay operation signal and to prevent the relay maloperation, going to step (1) after this step is completed.

9. The method according to claim 8, wherein in step (7), the s of sending the shielding signal by the relay maloperation signal shielding module further comprises:

sending a low electrical level signal by the relay maloperation signal shielding module when a fault is detected, amplifying the electrical level signal to a same amplitude as the relay operation signal by a signal amplifier circuit, and pulling down the relay operation signal to prevent the relay maloperation from occurring.

10. The method according to claim 8, wherein in step (1), the step of activating the voltage sampling circuit to sample the terminal voltage of the intermediate relay further comprises: transmitting the sampled voltage on a small resistor in the voltage sampling circuit to the analog-to-digital conversion module.

\* \* \* \* \*